(12) United States Patent
Lee et al.

(10) Patent No.: US 7,851,304 B2
(45) Date of Patent: Dec. 14, 2010

(54) NONVOLATILE MEMORY DEVICE AND FABRICATION METHOD

(75) Inventors: Woon-Kyung Lee, Seongnam-si (KR); Jeong-Hyuk Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1028 days.

(21) Appl. No.: 11/641,869

(22) Filed: Dec. 20, 2006

(65) Prior Publication Data
US 2008/0096350 A1    Apr. 24, 2008

(30) Foreign Application Priority Data
Oct. 20, 2006   (KR) ................... 10-2006-0102375

(51) Int. Cl.
*H01L 29/76* (2006.01)
(52) U.S. Cl. .................... 438/257; 438/981
(58) Field of Classification Search ......... 257/314–326, 257/E29.17
See application file for complete search history.

(56) References Cited

U.S. PATENT DOCUMENTS

| | | |
|---|---|---|
| 5,103,273 A | 4/1992 | Gill et al. |
| 5,321,288 A | 6/1994 | Gill et al. |
| 5,590,072 A * | 12/1996 | Choi ............... 365/185.01 |
| 6,337,245 B1 * | 1/2002 | Choi ..................... 438/258 |
| 6,573,568 B2 * | 6/2003 | Lin et al. ............... 257/365 |
| 6,620,681 B1 * | 9/2003 | Kim et al. .............. 438/257 |
| 2004/0229450 A1 * | 11/2004 | Ding ..................... 438/585 |

FOREIGN PATENT DOCUMENTS

| | | |
|---|---|---|
| KR | 1020020092234 A | 12/2002 |
| KR | 1020040070905 A | 8/2004 |
| KR | 1020050052598 | 6/2005 |
| KR | 1020050079233 | 8/2005 |
| KR | 1020060009810 A | 2/2006 |

* cited by examiner

*Primary Examiner*—Bradley K Smith
*Assistant Examiner*—Mohammad Choudhry
(74) *Attorney, Agent, or Firm*—Volentine & Whitt, PLLC

(57) ABSTRACT

Provided is a nonvolatile memory device and a fabrication method. The nonvolatile memory device includes an active region defined in a semiconductor substrate, a gate insulating layer formed on the active region and a plurality of gate patterns formed on the gate insulating layer, and crossing over the active region. The gate insulating layer includes a discharge region in a predetermined portion between the gate patterns, the discharge region having a lesser thickness than that of the gate insulating layer under the gate pattern, because a thickness portion of the gate insulating layer is removed to form the discharge region.

16 Claims, 12 Drawing Sheets

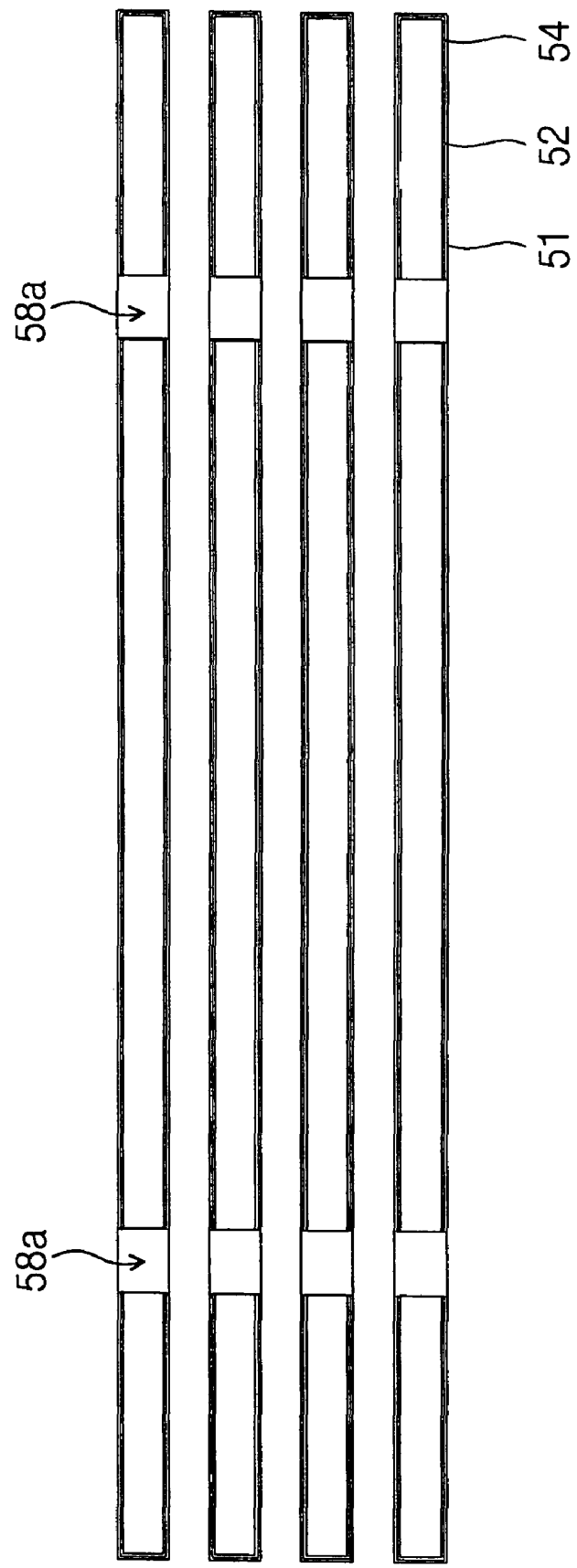

US 7,851,304 B2

NONVOLATILE MEMORY DEVICE AND FABRICATION METHOD

BACKGROUND

1. Field of the Invention

The present invention relates to a semiconductor device and fabrication method. More particularly, the invention relates to a nonvolatile memory device and fabrication method.

This U.S. non-provisional patent application claims priority under 35 U.S.C. §119 of Korean Patent Application No. 2006-102375, filed on Oct. 20, 2006, the subject matter of which is hereby incorporated by reference.

2. Description of the Related Art

As semiconductor devices become more highly integrated, the planar surface area occupied by the patterns and components implementing such devices decreases. However, there are finite limits to similar reductions in the vertical height of these patterns and components. As a result, contemporary semiconductor devices are being fabricated with increasing vertical heights.

As a result of this phenomenon, some of the fabrication processes used to form highly integrated patterns having relatively large heights make use of high-energy plasma. Such processes often result in an accumulation of plasma ions and/or electrical charge on pattern elements and components. Such an accumulation of ions and charge can have detrimental effects on the overall performance characteristic transistors within the semiconductor device.

For example, in certain nonvolatile memory devices, programming and erase operations are performed via a tunnel insulating layer. High reliability of this tunnel insulating layer is essential to proper operation of the devices. Ions and/or charge accumulated on pattern elements and components may migrate into the tunnel insulating layer, thereby degrading its reliability and durability. The reliability and durability of the tunnel insulating layer influences the endurance, data retention and hot temperature storage properties of the constituent memory device. Therefore, any degradation in the reliability of the tunnel insulating layer (directly or indirectly) results in detrimental effects on the operation and durability of transistors.

FIGS. 1 through 3 are cross-sectional views illustrating a fabrication method for a conventional nonvolatile memory device.

Referring to FIG. 1, an active region (not shown) is defined on a semiconductor substrate 10. A gate insulating layer 12 and a floating gate layer 14 are stacked on the active region. A dielectric layer 22 and a control gate layer 24 are formed on floating gate layer 14, and a hard mask layer 26 is formed on control gate layer 24.

Referring to FIG. 2, hard mask layer 26, control gate layer 24 and dielectric layer 22 are sequentially patterned to form a hard mask pattern 26a, a control gate electrode 24a and an inter-gate dielectric layer 22a under the control gate electrode 24a which cross over the active region. Ions and/or charge may accumulate in floating gate layer 14 as well as control gate electrode 24a and inter-gate dielectric layer 22a during high-energy plasma fabrication processes. The accumulated ions and/or charge may migrate to and accumulate on gate insulating layer 12, thereby degrading the performances properties of gate insulating layer 12.

Referring to FIG. 3, floating gate layer 14 is etched using hard mask pattern 26a as an etch mask to form a floating gate 14a self-aligned with control gate electrode 24a. During this process, plasma ions and/or charge may further accumulate on floating gate 14a. As floating gate 14a is formed in electrical isolation on the active region, any ions and/or charge accumulated on floating gate 14a move towards semiconductor substrate 10 which has a relatively low voltage potential and become trapped by gate insulating layer 12. Trapped ions and/or charge interfere with control voltages applied to the various components of the constituent memory device.

SUMMARY OF THE INVENTION

Embodiments of the present invention provide a nonvolatile memory device having a structure capable of discharging any ions and/or charge accumulated during fabrication. Related fabrication methods are also provided.

In one embodiment, the invention provides a nonvolatile memory device, comprising; an active region defined in a semiconductor substrate, a gate insulating layer formed on the active region, and a plurality of gate patterns formed on the gate insulating layer and crossing over the active region, wherein the gate insulating layer comprises a discharge region disposed between adjacent gate patterns and having a thickness less than the thickness of a portion of the gate insulating layer under at least one of the plurality of gate patterns.

In another embodiment, the invention provides a nonvolatile memory device, comprising; an active region defined in a semiconductor substrate, a source region and a drain region formed in the active region, a gate insulating layer formed on the active region, a ground selection line and a string selection line disposed on the gate insulating layer between the source region and the drain region and crossing over an upper portion of the active region, and a plurality of word lines disposed on the gate insulating layer between the ground selection line and the string selection line, wherein the gate insulating layer comprises a discharge region on the source region and the drain region, the discharge region having a thickness less than the thickness of a portion of the gate insulating layer under the word line.

In another embodiment, the invention provides a fabrication method for a nonvolatile memory device, the method comprising; forming a device isolation layer on a semiconductor substrate to define an active region, forming a gate insulating layer and a first conductive layer pattern, which are stacked on the active region, etching the first conductive layer pattern to form an opening exposing the gate insulating layer, removing a thickness portion of the gate insulating layer exposed through the opening to form a discharge region, forming a second conductive layer pattern filling the opening in the first conductive layer pattern, forming a dielectric layer and a third conductive layer on the second conductive layer, and sequentially patterning the third conductive layer, the dielectric layer, the second conductive layer and the first conductive layer to form a plurality of gate patterns crossing over the active region.

BRIEF DESCRIPTION OF THE DRAWINGS

FIGS. 5A, 5B and 5C and FIGS. 6 through 9 are views illustrating a fabrication method of a nonvolatile memory device according to an embodiment of the invention.

DESCRIPTION OF EMBODIMENTS

Embodiments of the invention will be described in some additional detail with reference to the accompanying drawings. The present invention may, however, be embodied in different forms and should not be constructed as limited to only the embodiments set forth herein. Rather, these embodiments are presented as teaching examples. Throughout the written description and drawings, like reference numbers refer to like or similar elements.

Figure 1:
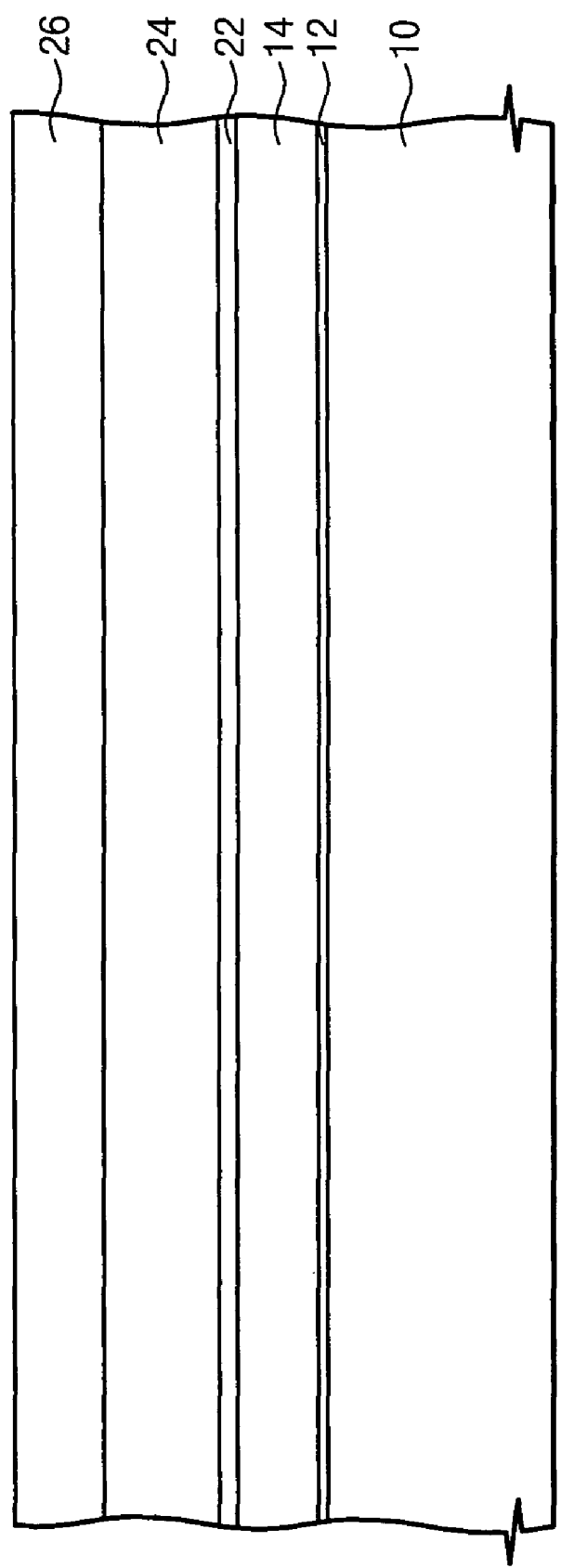
FIGS. 1 through 3 are cross-sectional views illustrating a fabrication method for a conventional nonvolatile memory device.
Figure 2:
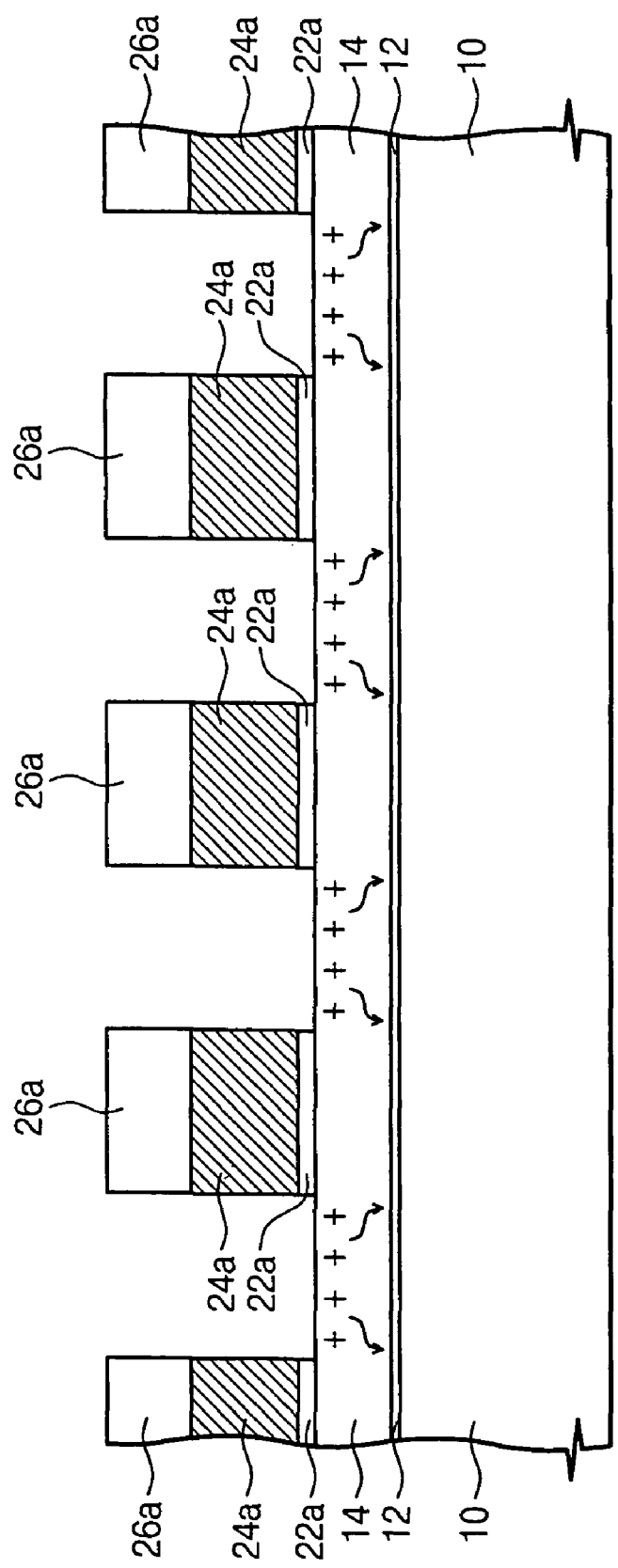
Figure 3:
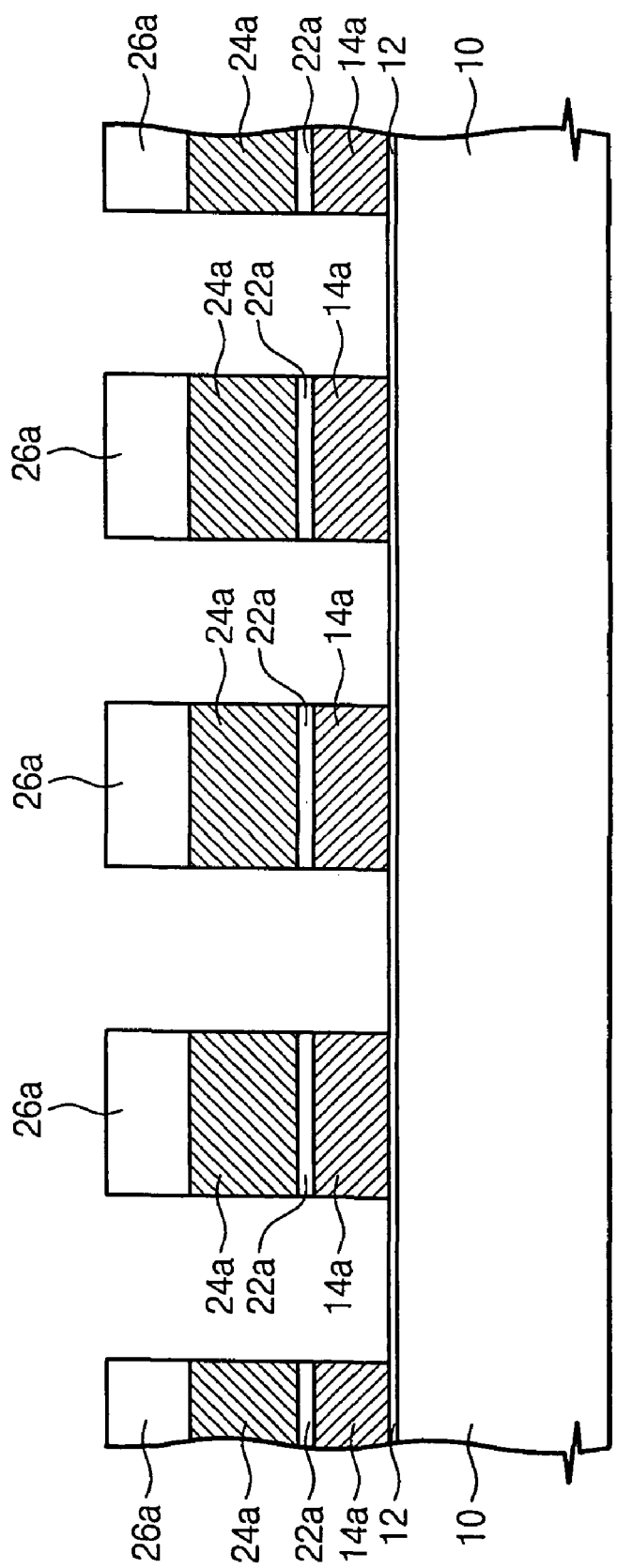
Figure 4A:
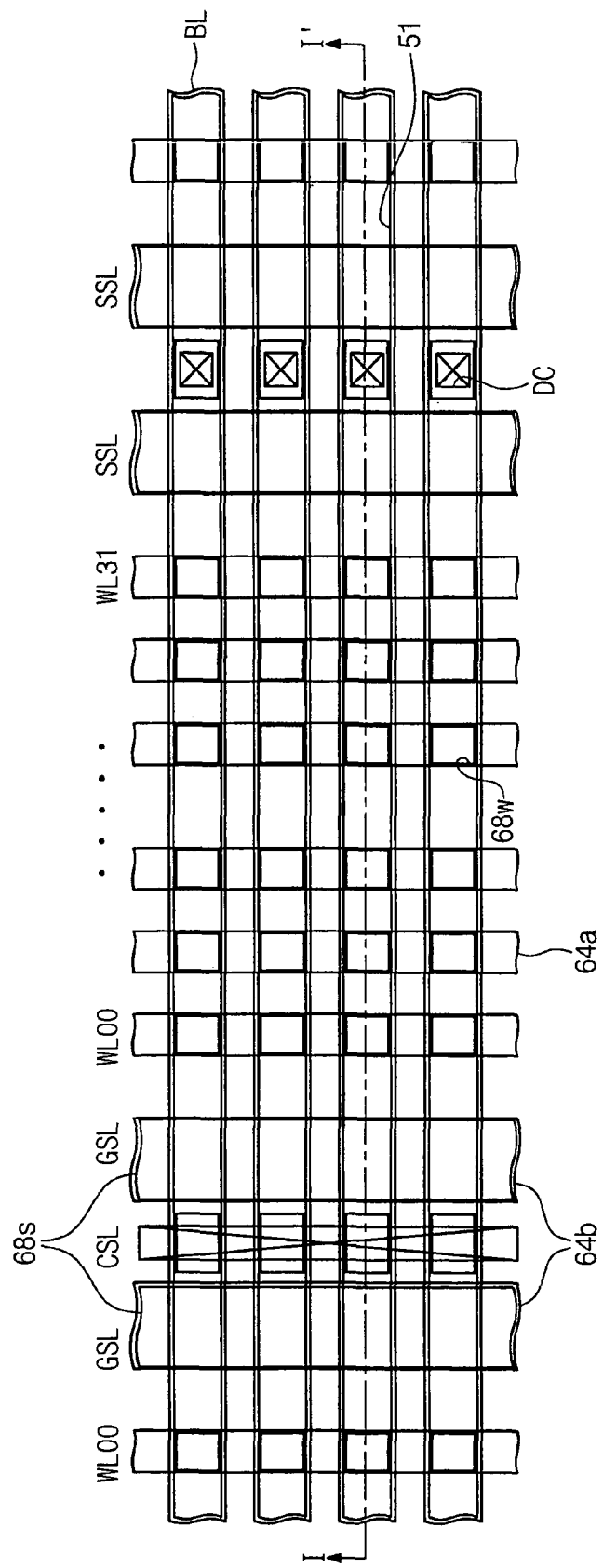
FIG. 4A is a plan view of a nonvolatile memory device according to an embodiment of the invention.
Figure 4B:
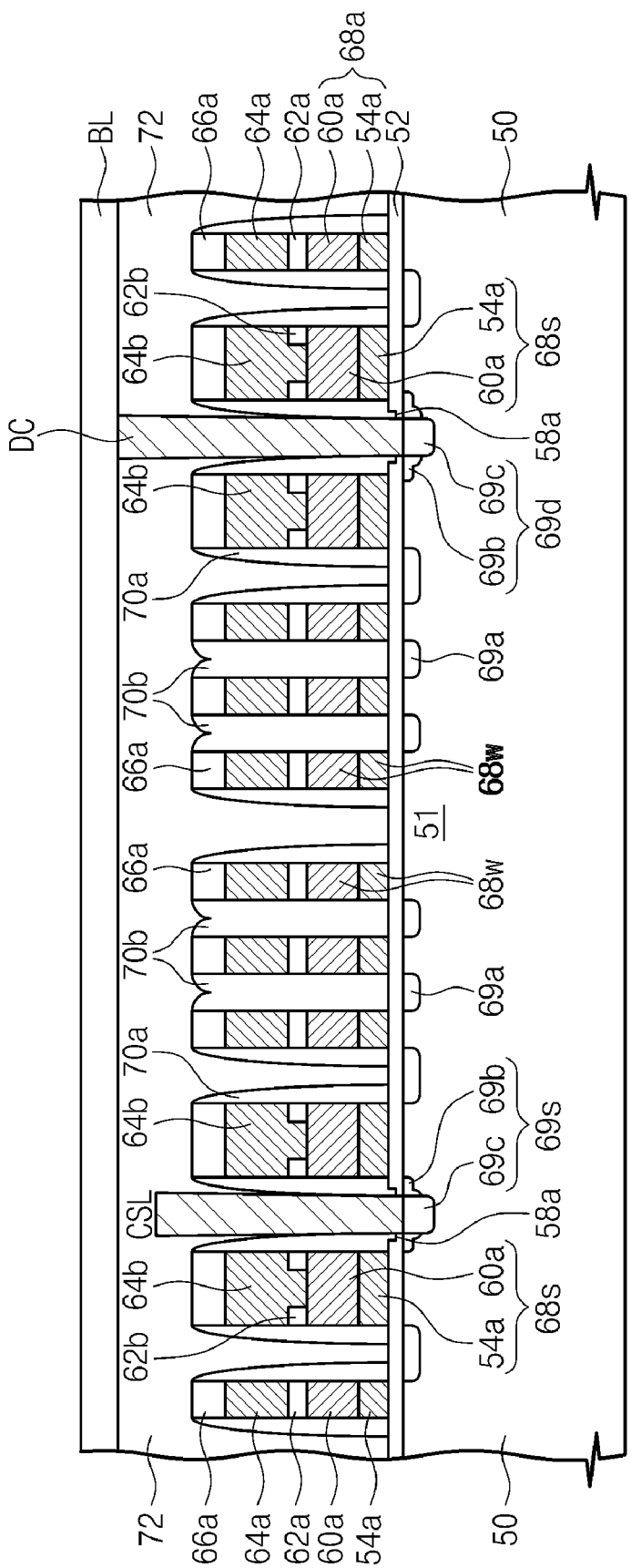
FIG. 4B is a cross-sectional view taken along line I-I' of FIG. 4A.

FIG. 4A is a plan view of a nonvolatile memory device according to an embodiment of the invention. FIG. 4B is a cross-sectional view taken along line I-I' of FIG. 4A.

As illustrated in FIGS. 4A and 4B, an embodiment of the invention may be applied to a nonvolatile memory device having a NAND type cell array. However, the present invention is not limited to only this type of device but may be applied to any semiconductor device potentially requiring the discharge of ions and/or charge accumulated due to plasma damage. For example, the present invention may be applied to a nonvolatile memory device having the NOR type cell array as well as a NAND type cell array.

Referring to FIGS. 4A and 4B, the NAND type cell array includes a plurality of active regions defined on a semiconductor substrate. Active regions 51 may extend in parallel with each other in a row direction. Active regions 51 may be defined by a device isolation layer (not shown), such as a conventionally understood trench isolation structure.

A gate insulating layer 52 is formed on active regions 51. A plurality of gate patterns are disposed on gate insulating layer 52 and cross over active regions 51. In the NAND type cell array, the gate patterns include a ground selection line GSL and a string selection line SSL. Also, the gate patterns include a plurality of word lines WLn disposed between the ground selection line GSL and the string selection line SSL.

The cell array may include pluralities of the ground selection lines GSL and the string selection lines SSL, which are disposed in mirror symmetry. Thus, one ground selection line GSL may be adjacent to another ground selection line GSL, and one string selection line SSL may be adjacent to another string selection line SSL. A source region 69s is formed in the active region between the ground selection lines GSL, and a drain region 69d is formed in the active region between the string selection lines SSL. A common source line CSL, which crosses over active region 51 to connect source regions 69s, is disposed between the ground selection lines GSL. A bit line plug connected to drain region 69d is formed between the string selection lines SSL.

In an embodiment of the invention, gate insulating layer 52 is disposed on an entire surface of active region 51 as well as under the gate patterns. Gate insulating layer 52 includes a discharge region 58a having a thickness that is thinner than that of another region on a predetermined portion between the gate patterns. Preferably, discharge region 58a is formed on a region that does not influence the performance characteristics of a cell transistor. For example, in one embodiment, discharge region 58a is formed at a portion of the device connected to an interconnection. In the NAND type cell array, discharge region 58a may be formed in source region 69s and drain region 69d. In one embodiment, discharge region 58a is separated from the adjacent ground and string selection lines GSL and SSL by predetermined distances.

Source region 69a and drain region 69d may include a doping layer 69b having a junction with a depth different from others due to a thickness difference between discharge region 58a and a peripheral region thereof. Therefore, doping layer 69b has a greater depth to a lower portion of discharge region 58a than the peripheral region. A cell diffusion layer 69a is formed in active region 51 between the word lines WLn, between a first word line WL00 and the ground selection line GSL, and between a last word line WL31 and the string selection line SSL.

Space insulating layers 70a are formed on sidewalls of the gate patterns. The space insulating layers 70a are separated from each other between the ground selection lines GSL and between the string selection lines SSL. Meanwhile, the space insulating layers are in contact with each other between the word lines SSL to cover active regions 51 between the word lines WLn. Source region 69s and drain region 69d may further include a high concentration doping layer 69c. High concentration doping layer 69c may have a junction arranged in relation to an edge of space insulating layer 70a.

Space insulating layer 70a may cover a portion of discharge region 58a. As the common source line CSL and a bit line contact DC are formed such that they are aligned with spacer insulating layers 70a, the common source line CSL and a bit line contact DC are connected to the active region through discharge region 58a. The common source line CSL and the bit line contact DC penetrate an interlayer insulating layer 72. A bit line BL connected to the bit line contact DC is formed on interlayer insulating layer 72 such that it may extend in parallel with the active region.

The word line WLn includes a floating gate 68w formed on active region 51, a control gate electrode 64a formed on floating gate 68w and crossing over active region 51, and an inter-gate dielectric layer 62a interposed between floating gate 68w and control gate electrode 64a. A hard mask pattern 66a may remain on the control gate electrode 64a. Floating gate 68w may have a multi-stacked structure where a lower conductive layer pattern 54a and an upper conductive layer pattern 60a are stacked. Also, the floating gate is formed such that it is isolated in a region where the word line WLn and active region 51 intersected with each other.

Each of the ground and string selection lines GSL and SSL may include a lower selection gate 68s, an upper selection gate 64b and a dielectric layer pattern 62b interposed therebetween. Lower selection gate 68s and upper selection gate 64b may cross over the active region or may be separated on active region 51. Dielectric layer pattern 62b is interposed between portions of lower selection gate 68s and upper selection gate 64b such that upper selection gate 64b and lower selection gate 68s are connected.

FIGS. 5A, 5B, 5C and FIGS. 6 through 9 are views illustrating a fabrication method for a nonvolatile memory device according to an embodiment of the invention.

Figure 5A:
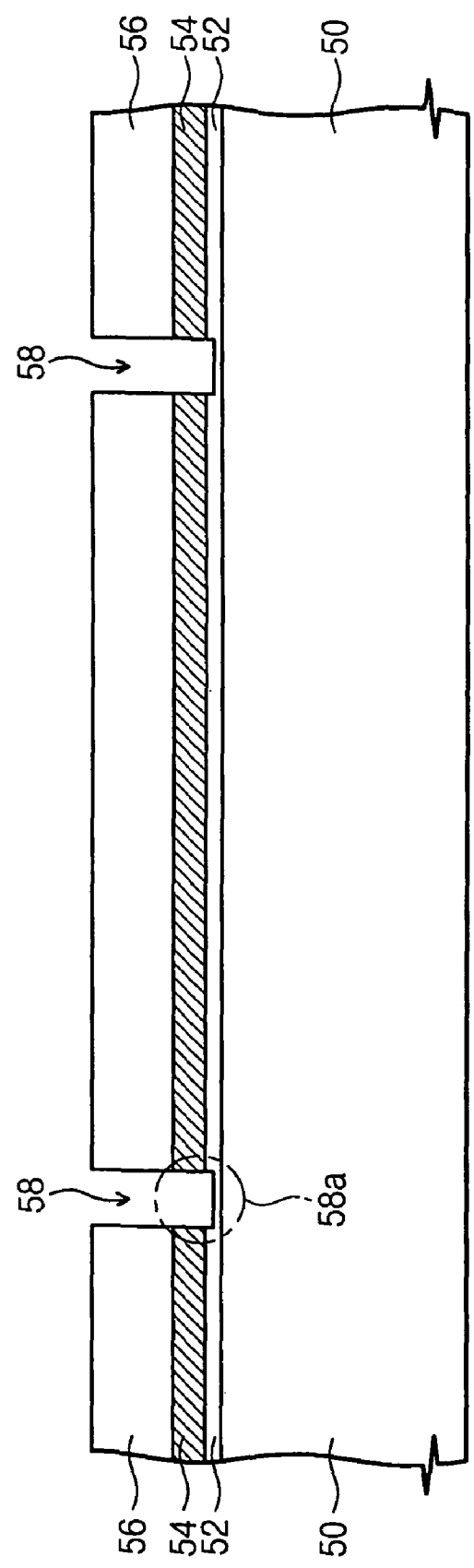
Figure 5B:
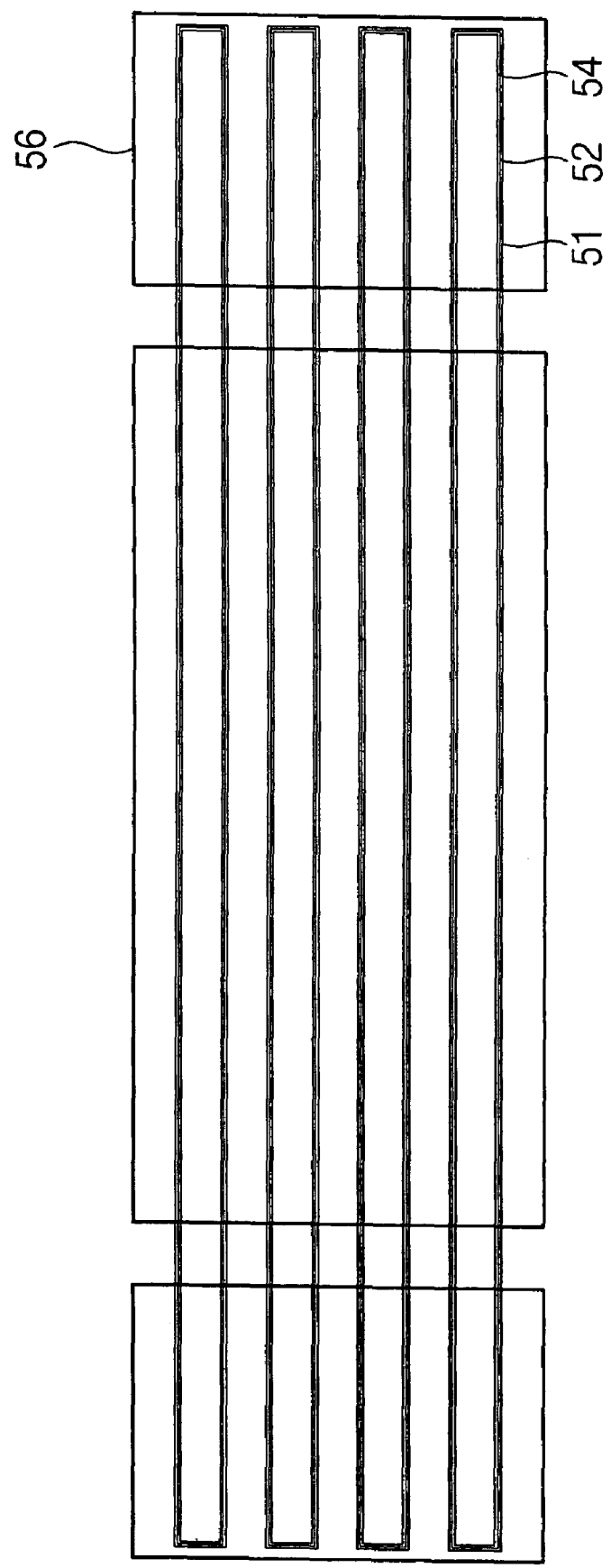

Referring to FIGS. 5A and 5B, a device isolation layer is formed on a semiconductor substrate 50 to define active regions 51. Active regions 51 extend in parallel with each other. A gate insulating layer 52 and a first conductive layer pattern 54 are formed on an active region 51. Gate insulating layer 52 and first conductive layer pattern 54 may be formed, for example, on active region 51 when a device isolation layer is formed using a self-aligned trench isolation technique.

A mask pattern 56 having an opening 58 exposing a predetermined portion of active region 51 is formed on first conductive layer pattern 54. Opening 58 may extend in a direction crossing active region 51.

First conductive layer pattern 54 is etched using mask pattern 56 as an etch mask to expose gate insulating layer 52. A defined portion of exposed gate insulating layer 52 is removed to form a thin discharge region 58a of predetermined thickness.

As illustrated in FIG. 5C, a plurality of discharge regions 58a may be formed within a cell array. In one embodiment, charge regions 58a are formed at a portion where an interconnection is made in order to minimize factors that may influence the performance characteristics of associated transistors.

Figure 6:
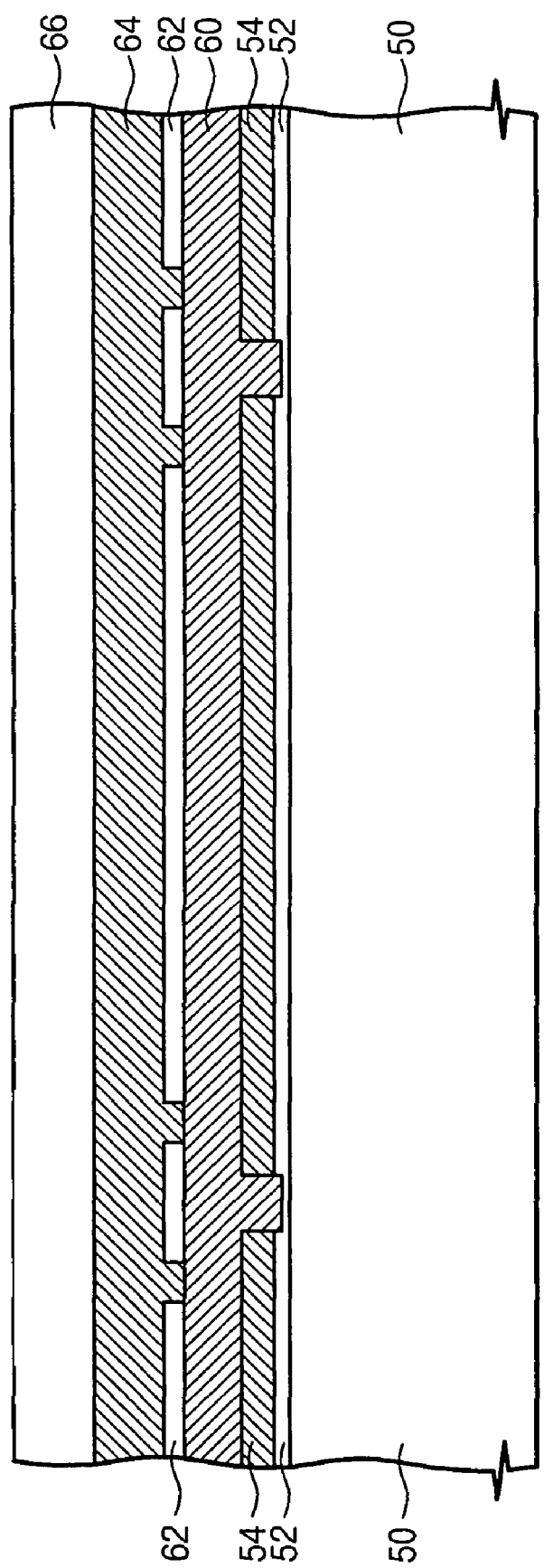

Referring to FIG. 6, mask pattern 56 is removed and a second conductive layer pattern 60 is formed on active region 51. The second conductive layer pattern 60 may extend along active region 51. Also, second conductive layer pattern 60 may be successively formed over a device isolation layer at a position where a ground selection line GSL and a string selection line SSL will subsequently be formed. The opening formed in first conductive layer pattern 54 is filled with second conductive layer pattern 60.

A dielectric layer 62 and a third conductive layer 64 may be formed on an entire surface of semiconductor substrate 50, including second conductive layer pattern 60. Also, a hard mask layer 66 may be formed on the third conductive layer 64.

Figure 7:
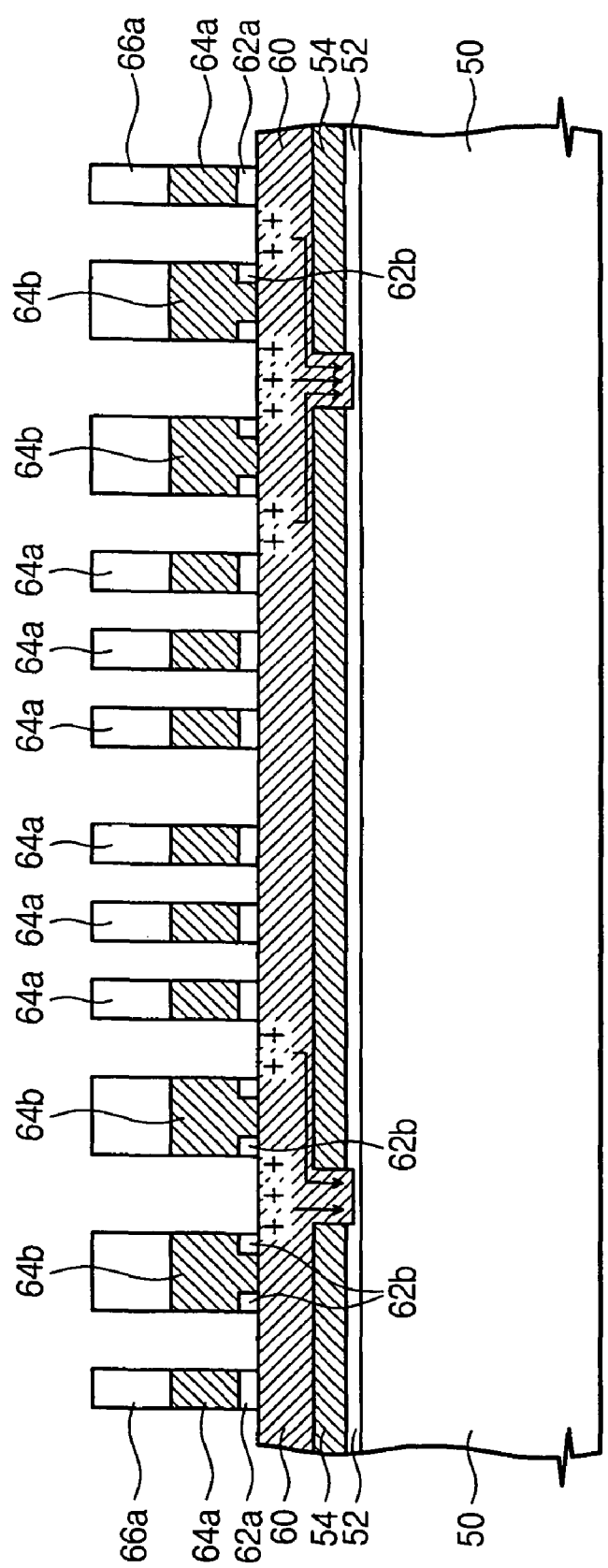

Referring to FIG. 7, hard mask layer 66, third conductive layer 64 and dielectric layer 62 are etched to form a hard mask pattern 66a, a control gate electrode 64a, an inter-gate dielectric layer 62a in a region where word lines will be formed, and also form an upper selection gate 64b and an inter-gate insulating layer 62b in a region where the string and ground selection lines SSL and GSL will be formed. In an embodiment of the invention, ions and/or charge potentially accumulated due to plasma damage will be concentrated in discharge region 58a, which has a relatively thin thickness and may thus be readily discharged to semiconductor substrate 50 through discharge region 58a.

Figure 8:
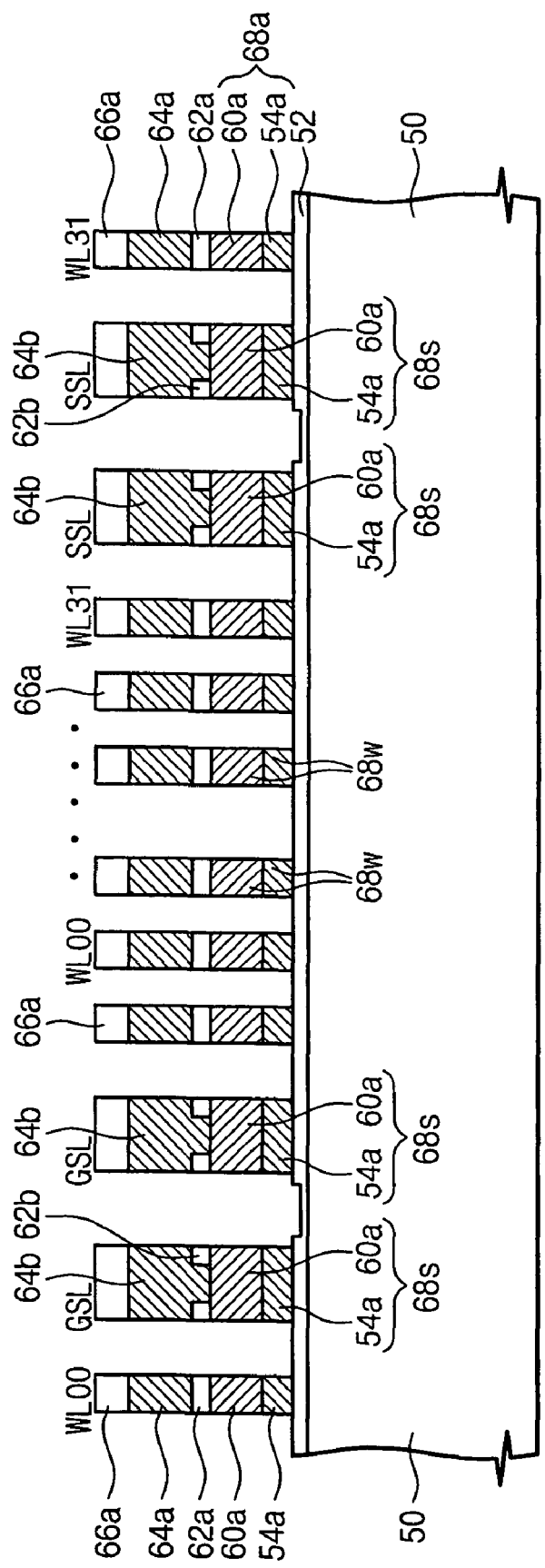

Referring to FIG. 8, first conductive layer pattern 54 and second conductive layer pattern 60 are etched using hard mask pattern 66a as an etch mask to form a floating gate 68w self-aligned with control gate electrode 64a and a lower selection gate 68s self-aligned with upper selection gate 64b. As the result, a plurality of gate patterns may be formed on semiconductor substrate 50. The gate patterns include the ground selection line GSL and the string selection line SSL, which are disposed at both sides of the discharge regions 58a, and also include word lines WLn disposed between the ground selection line GSL and the string selection line SSL. Any ions and/or charge accumulated during a process of forming the gate patterns will be concentrated into discharge region 58a or may be discharged to semiconductor substrate 50 through discharge region 58a.

Figure 9:
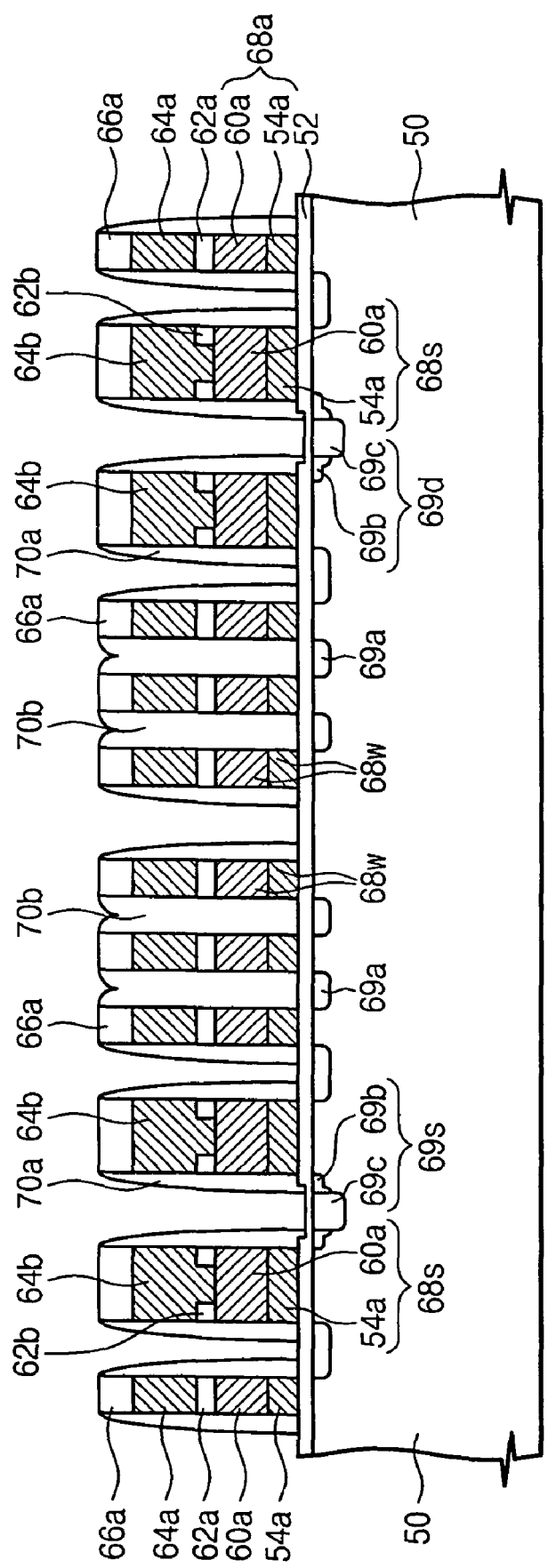

Referring to FIG. 9, doping layers 69a, 69b and 69c are formed on active region 51 between the gate patterns. Doping layer 69a may have a depth difference corresponding to a thickness difference between discharge region 58a and an associated peripheral region.

Space insulating layers 70a and 70b are formed on sidewalls of the gate patterns. Space insulating layer 70a formed on sidewalls of the ground selection line GSL and the string selection line SSL may partially overlap discharge region 58a. Space insulating layer 70b between the word lines WLn may cover active region 51 between the word lines WLn. The high concentration doping layer 69c is formed between the ground selection lines GSL and between the string selection lines SSL to form a source region 69s and a drain region 69d. The high concentration doping layer 69c may have a junction aligned with an edge of space insulating layer 70a.

Thereafter, an interlayer insulating layer 72 is formed, and a common source line CSL and a bit line contact DC are then formed. Subsequently, the bit line BL is formed to thereby obtain a structure illustrated in FIGS. 4A and 4B.

According to the embodiments of the invention described above, a predetermined thickness portion of the gate insulating layer is removed to form the discharge region having a relatively thin thickness. Due to this characteristic, ions and/or charge accumulated due to the plasma damage may be concentrated into the discharge region or discharged to the semiconductor substrate through the discharge region. Thus, it is possible to markedly reduce the likelihood of gate insulating layer degradation caused by the accumulation of ions and/or charge.

The above-disclosed subject matter is to be considered illustrative, and not restrictive, and the appended claims are intended to cover all modifications, enhancements, and other embodiments, which fall within the scope of the invention. Thus, to the maximum extent allowed by law, the scope of the present invention is to be determined by the broadest permissible interpretation of the following claims and their equivalents, and shall not be restricted or limited to only the foregoing embodiments.

What is claimed is:

1. A nonvolatile memory device, comprising:
   an active region defined in a semiconductor substrate;
   a gate insulating layer formed on the active region; and
   a plurality of gate patterns formed on the gate insulating layer and crossing over the active region,
   wherein the gate insulating layer comprises a discharge region disposed between adjacent gate patterns and an insulating region disposed under at least one of the plurality of gate patterns, wherein a thickness of the discharge region is thinner than that of the insulating layer.

2. The nonvolatile memory device of claim 1, further comprising:
   an interconnection layer penetrating a portion of the discharge region and being connected to the active region.

3. The nonvolatile memory device of claim 1, further comprising:
   a doping layer formed in the active region between the adjacent gate patterns, wherein a portion of the doping layer beneath the discharge region has a greater depth than portions of the doping layer proximate the discharge region.

4. The nonvolatile memory device of claim 1, further comprising:
   a space insulating layer formed on sidewalls of the gate patterns, wherein the space insulating layer covers a portion of the discharge region.

5. The nonvolatile memory device of claim 4, further comprising:
   a high concentration doping layer formed under the discharge region, the high concentration doping layer having a junction aligned with an edge of the space insulating layer.

6. A nonvolatile memory device, comprising:
   an active region defined in a semiconductor substrate;
   a source region and a drain region formed in the active region;
   a gate insulating layer formed on the active region;
   a ground selection line and a string selection line disposed on the gate insulating layer between the source region and the drain region and crossing over an upper portion of the active region; and
   a plurality of word lines disposed on the gate insulating layer between the ground selection line and the string selection line,
   wherein the gate insulating layer comprises a discharge region and an insulating region, the discharge region being disposed on the source region and the drain region, the insulating region being disposed under the ground selection line, the string selection line and the word lines, and a thickness of the discharge region being thinner than that of the insulating region.

7. The nonvolatile memory device of claim 6, further comprising:
a common source region connected to the source line and crossing over the upper portion of the active region; and
a bit line contact connected to the drain region.

8. The nonvolatile memory device of claim 6, wherein portions of the source and drain regions beneath the discharge region have a greater depth than portions of the source and drain regions proximate the discharge region.

9. The nonvolatile memory device of claim 6, further comprising:
a space insulating layer formed on sidewalls of the word lines, the ground selection line and the string selection line, wherein the space insulating layer covers a portion of the discharge region.

10. The nonvolatile memory device of claim 9, wherein the space insulating layer between the word lines covers the active region between the word lines.

11. The nonvolatile memory device of claim 9, wherein the source and drain regions further comprise a high concentration doping layer under the discharge region, the high concentration doping layer having a junction aligned with an edge of the space insulating layer.

12. The nonvolatile memory device of claim 6, wherein the word line comprises:
a first floating gate formed on the active region;
a second floating gate formed on the first floating gate;
a control gate electrode formed on the second floating gate and crossing over the active region; and
an inter-gate dielectric layer interposed between the control gate electrode and the first floating gate, and between the control gate electrode and the second floating gate.

13. The nonvolatile memory device of claim 1, wherein the gate insulating layer entirely covers the active region.

14. The nonvolatile memory device of claim 1, wherein the discharge region is spaced apart from a sidewall of the gate pattern.

15. The nonvolatile memory device of claim 6, wherein the gate insulating layer entirely covers the active region.

16. The nonvolatile memory device of claim 6, wherein the discharge region is spaced apart from the ground selection line and the string selection line.

* * * * *